(12) United States Patent
Savelli et al.

(10) Patent No.: US 8,962,969 B2
(45) Date of Patent: Feb. 24, 2015

(54) MODULATABLE THERMOELECTRIC DEVICE

(75) Inventors: Guillaume Savelli, Grenoble (FR); Philippe Coronel, Barraux (FR); Marc Plissonnier, Eybens (FR)

(73) Assignee: Commissariat a l'Energie Atomique et aux Energies Altenatives, Paris (FR)

( * ) Notice: Subject to any disclaimer, the term of this patent is extended or adjusted under 35 U.S.C. 154(b) by 0 days.

(21) Appl. No.: 13/643,804

(22) PCT Filed: May 3, 2011

(86) PCT No.: PCT/FR2011/000271
§ 371 (c)(1),
(2), (4) Date: Jan. 7, 2013

(87) PCT Pub. No.: WO2011/138523
PCT Pub. Date: Nov. 10, 2011

(65) Prior Publication Data
US 2013/0098416 A1    Apr. 25, 2013

(30) Foreign Application Priority Data

May 5, 2010    (FR) ..................................... 10 01931

(51) Int. Cl.
*H01L 35/00* (2006.01)
*H01L 35/32* (2006.01)
(52) U.S. Cl.
CPC .............. *H01L 35/32* (2013.01); *H01L 35/325* (2013.01)

USPC .......................................... 136/200; 136/228
(58) Field of Classification Search
CPC ...................................................... H01L 35/32
USPC .................................................. 136/200, 228
See application file for complete search history.

(56) References Cited

U.S. PATENT DOCUMENTS

| | | | |
|---|---|---|---|
| 3,723,189 A | | 3/1973 | Zahn |
| 5,261,747 A | * | 11/1993 | Deacutis et al. .............. 374/137 |
| 5,705,434 A | * | 1/1998 | Imanishi et al. ................. 438/55 |
| 2007/0084497 A1 | * | 4/2007 | Strnad ........................... 136/203 |
| 2008/0017356 A1 | * | 1/2008 | Gruss et al. ............. 165/104.33 |
| 2008/0023057 A1 | * | 1/2008 | Nakajima et al. ............. 136/201 |

FOREIGN PATENT DOCUMENTS

| | | |
|---|---|---|
| DE | 32 02 791 A1 | 8/1983 |
| DE | 35 23 773 A1 | 1/1987 |
| FR | 2 015 440 A1 | 4/1970 |

* cited by examiner

*Primary Examiner* — Allison Bourke
(74) *Attorney, Agent, or Firm* — Oliff PLC

(57) ABSTRACT

A thermoelectric device includes first and second legs extending continuously between first and second heat sources. The first and second legs respectively include first and second conducting elements and third and fourth conducting elements. The first and third conducting elements are adjacent and separated by an insulator. The second and fourth conducting elements are adjacent and separated by an insulator. The device also includes selection means enabling formation of a first thermocouple from the first and second conducting elements and formation of a second thermocouple from the third and fourth conducting elements.

15 Claims, 11 Drawing Sheets

MODULATABLE THERMOELECTRIC DEVICE

BACKGROUND OF THE INVENTION

The invention relates to a thermoelectric device comprising thermoelectric legs in contact with a hot source and a cold source. Each leg comprises a conducting element. The conducting elements, of different thermoelectric natures, are connected to one another to form a thermocouple.

STATE OF THE ART

FIG. 1 represents a conventional architecture of a thermocouple module. Each thermocouple 1 is formed by a couple of legs 2a and 2b made from conducting materials of different natures connected to one another via one of their ends by an internal metal connector 3. Leg 2a is generally made from P-type material and leg 2b is generally made from N-type material, typically from P-type and N-type silicon. Such a couple can also be called thermopair.

The module generally comprises a plurality of thermocouples 1 electrically connected in series by link metal connectors 4a. Terminal metal connectors 4b, 4c are situated at the ends of the series of thermocouples 1 to provide the electric connections of the module.

The conducting materials or elements forming thermoelectric legs 2a and 2b are of different thermoelectric natures. What is meant by materials of different thermoelectric natures is materials of different chemical compositions able to form a thermocouple, or made from the same material having different doping types.

The thermoelectric module can be used in Seebeck effect or in Peltier effect mode. It comprises a hot side reservoir 5 at a temperature $T_h$ and a cold side reservoir 6 at a temperature $T_f$. Reservoirs 5 and 6 are arranged on each side of thermocouples 1, respectively at the level of connectors 3 and at the level of connectors 4a.

In Seebeck mode, the module produces electric energy from a temperature gradient between hot side 5 and cold side 6. This mode is also called power generator mode.

In Peltier mode, application of a current at the terminals of the module enables a temperature gradient to be generated between the hot side 5 and cold side 6. This mode is also called cooling mode.

The efficiency of the thermoelectric module does in fact depend on the materials used, on its geometry, and on the environment of use. A conventional module is thus either optimized for cooling mode or optimized for power generator mode, but never for both at the same time.

SUMMARY OF THE INVENTION

The object of the invention is to provide a single compact thermoelectric device that is able to operate in optimal manner either in Seebeck mode or in Peltier mode, as desired.

These objectives tend to be achieved by the fact that the thermoelectric device comprises first and second legs having first ends in contact with a first surface and second ends in contact with the second surface. The first and second legs respectively comprise first and second conducting elements extending continuously between the first and second surfaces. The first and second legs respectively comprise third and fourth conducting elements extending continuously between the first and second surfaces. The third conducting element is adjacent to the first conducting element and separated from the first conducting element by an insulator. The fourth conducting element is adjacent to the second conducting element and separated from the second conducting element by an insulator. The device also comprises selection means enabling formation of a first thermocouple from first and second conducting elements and formation of a second thermocouple from third and fourth conducting elements.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

A thermoelectric device can be optimized by adapting its geometry to the conditions of use and to the desired operating mode. A model obtained by means of the general equations of thermoelectricity and thermics can be used to determine this optimal geometry.

Figure 1:
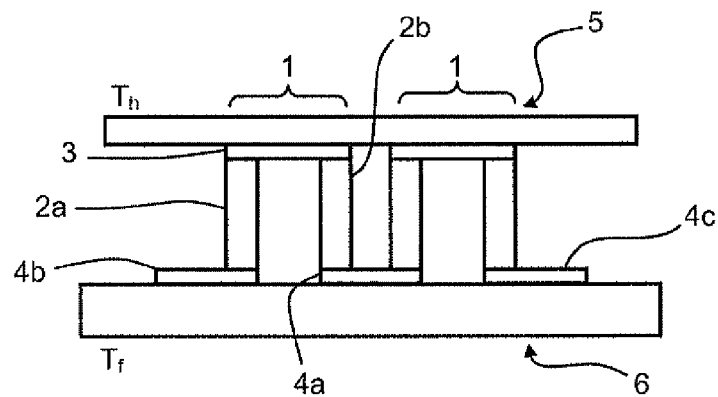
FIG. 1 represents a thermoelectric module according to the prior art.

A case study based on the module of FIG. 1 is described in the following. It highlights the fact that optimization of the device in Seebeck mode differs from that of Peltier mode.

Table 1 groups together the electric, thermal and geometric parameters of the thermoelectric device used in this modelling. To define the environment of the device, a heat exchanger is placed between the device and the cold side reservoir 6. The characteristics of the heat exchanger are also indicated in table 1.

The parameters of the first category (temperature) are the temperature $T_h$ of the hot side 5 and the temperature $T_f$ of the cold side 6, in Kelvin.

The second category of parameters defines the intrinsic characteristics of the materials such as the Seebeck coefficient S, thermal conductivity λ and electric resistivity ρ of the electrically conducting materials forming the legs, and also the thermal conductivity $\lambda_{MAT}$ of the matrix, i.e. of the electrically insulating material between the legs.

The third category characterizes the geometry of the device, i.e. the number of legs n (with N=n/2 being equal to the number of thermocouples), the height L of the legs, the cross-section $A_{np}$ of the legs defined in the present case by a square having sides with a dimension b ($A_{np}=b^2$), the distance d between two consecutive legs and the available surface $A_{te}$ on which the legs are distributed.

TABLE 1

| Categories | Parameters | Variables | Values |
|---|---|---|---|
| Temperature | Hot side temperature | $T_h$ | 350 K |
|  | Cold side temperature | $T_f$ | 300 K |
| Materials | Seebeck coefficient | S | 4.00E−04 V/K |
|  | Thermal conductivity | $\lambda$ | 1.5 W/m/K |
|  | Electric resistivity | $\rho$ | 1.60E−05 Ω·m |
|  | Matrix thermal conductivity | $\lambda_{MAT}$ | 0.026 W/m/K |
| Geometry | Number of legs | n | 1.00E+04 |
|  | Height of legs | L | 4.00E−05 m |
|  | Size of legs | b | VAR in m |
|  | Cross-section of legs | $A_{np}$ | VAR in m$^2$ |
|  | Distance between two legs | d | VAR in m |
|  | Available surface | $A_{te}$ | 1.00E−04 m$^2$ |
| Heat exchange | Heat diffusion surface | $A_{hs}$ | 2.00E−04 m$^2$ |
|  | Heat transfer coefficient | h | 1.00E+03 W/m$^2$/K |
| Resistivity | Contact resistance | $R_C$ | 1.00E−11 Ω·m$^2$ |
|  | Internal resistance of the device | $R_{int}$ | VAR in Ω |

The "heat exchange" category parameters characterize the environment of the device on the cold side: the heat diffusion surface $A_{hs}$ of the heat exchanger and the heat transfer coefficient h of the heat exchanger between the device and the cold side reservoir or cold source. This cold source is for example air at ambient temperature ($T_f$=300K) and the heat exchanger with this air can be a metal plate or a substrate on which the legs are formed.

The "resistivity" category parameters are the contact resistance $R_C$ representing the quality of the contact between each leg 2a, 2b and connectors 3, 4a, 4b and 4c, and the internal resistance $R_{int}$, corresponding to the total resistance of the device measured at the terminals of the series of thermocouples.

In this modelling example, the hot and cold sides are respectively at temperatures $T_h$ equal to 350 Kelvin and $T_f$ equal to 300 Kelvin. The surface of the module $A_{te}$ is fixed at 1 cm$^2$ on which 10,000 legs are distributed, i.e. 5,000 thermocouples. The legs have a length of 40 μm and are separated by air. Finally parameters relating to the heat exchange are a surface $A_{hs}$ of 2 cm$^2$ and a heat transfer coefficient h of 1000 W.m$^{-2}$.K$^{-1}$.

The temperature ($T_f$) of cold side 6 does not really correspond to the cold temperature of the thermocouple, at the level of connector 4a, in particular due to the heat diffusion on hot side 5. The cold side of the thermocouple is thus at a higher temperature $T_c$ than the temperature $T_f$. It is therefore the temperature difference of the device $T_h-T_c$ that is taken into account in the equations and not the temperature difference of the environment $T_h-T_f$.

It is proposed to study the influence of the cross-section of the legs $A_{np}$ on the performances of a thermoelectric device operating according to Seebeck effect, and then according to Peltier effect. The parameters b and $A_{np}$ respectively corresponding to the side and cross-section of the legs are therefore variable.

The electric power $Q_{gen}$ generated in Seebeck mode can be expressed using the parameters of table 1 by the relation:

$$Q_{gen} = \frac{N^2 \times S^2 \times (T_h - T_c(A_{np}))^2}{4 R_{int}^2(A_{np}) \times A_{hs}} \tag{1}$$

Relation (1) involves the parameters $T_c$ and $R_{int}$, both of which are unknown and dependent on the cross-section of the legs $A_{np}$.

The internal resistance $R_{int}$ is written:

$$R_{int}(A_{np}) = 2N \times \left(\frac{\rho \times L}{A_{np}} + \frac{2R_C}{A_{np}}\right) \tag{2}$$

To know the expression of $T_c$, the equation presenting the balance of powers at the level of the heat exchanger has to be written:

$$P_{Seeb} + P_{cond} + P_j = P_{hs} \tag{3}$$

where $P_{seeb}$ represents the thermoelectric power generated at the interface with the heat exchanger (at temperature $T_c$), $P_{cond}$ represents the power transferred by conduction, $P_j$ the power generated by Joule effect and $P_{hs}$ the power removed by (natural or forced) convection at the level of the heat exchanger. These four terms involve $T_c$. By replacing each of the terms by its expression, equation (3) becomes:

$$N \times S \times T_c \times I + \left(\frac{2N \times \lambda \times \Delta T \times A_{np}}{L} + \frac{\lambda_{air} \times \Delta T \times A_{air}}{L}\right) + \frac{1}{2} R_{int} \times I^2 = \tag{4}$$
$$(T_c - T_f) h A_{hs}$$

where $\Delta T$ represents the temperature difference $T_h-T_c$, $\lambda_{air}$ the thermal conductivity of the air separating the legs, I the current generated by the series of thermocouples and $A_{air}$ the heat exchange surface with the air on the device side ($A_{air}=A_{te}-2N.A_{np}$).

The expression of $T_c$ in function of the parameter $A_{np}$ can thus be obtained from relation (4).

By replacing the internal resistance $R_{int}$ and temperature $T_c$ in relation (1) by their respective expressions (2) and (4), the generated electric power $Q_{gen}$ can be expressed solely according to the cross-section of the legs $A_{np}$.

Figure 2:
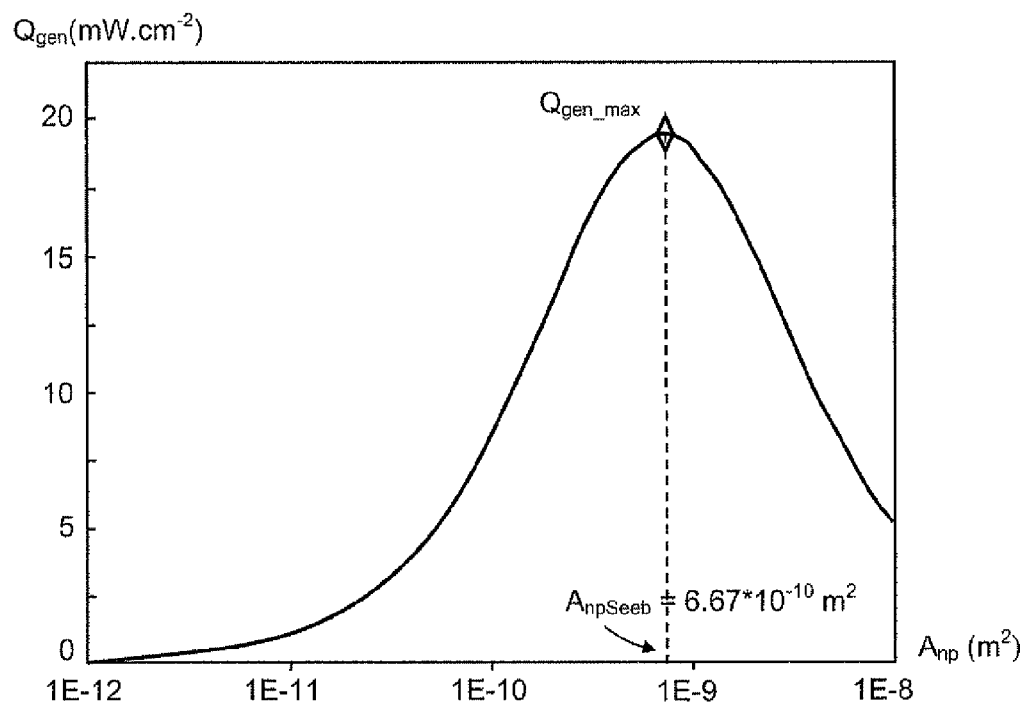
FIG. 2 represents a graph of the electric power generated by a thermoelectric device in Seebeck mode versus the cross-section of the legs.

FIG. 2 represents the variation of $Q_{gen}$ versus the cross-section of the legs $A_{np}$. It can be observed that maximum power $Q_{gen\_max}$ is obtained for a cross-section $A_{npSeeb}=6.67*10^{-10}$ m$^2$, corresponding to a square with sides having a dimension b=26 μm.

This value $A_{npSeeb}$ can also be obtained analytically by solving the equation:

$$\left(\frac{\partial Q_{gen}}{\partial A_{np}}\right)_{A_{np}=A_{npSeeb}} = 0 \tag{5}$$

$$= \left(\frac{\partial \left(\frac{N^2 \times S^2 \times (T_h - T_c(A_{np}))^2}{4 \times (R_{int}(A_{np}))^2 \times A_{hs}}\right)}{\partial A_{np}}\right)_{A_{np}=A_{npSeeb}}$$

In similar manner, modelling can be performed for a device operating according to Peltier effect. An input current I of 10 mA is applied to the thermoelectric device. Taking account of the power generated by Peltier effect, the losses by Joule effect and by thermal conduction, the cold power of a thermoelectric device in Peltier mode can be written in the form:

$$Q_{cold} = N \times S \times I \times T_c - \frac{1}{2} R_{int}(A_{np}) \times I^2 - K(A_{np}) \times (T_h - T_c) \qquad (6)$$

This equation (6) involves the variable $A_{np}$ representative of the cross-section of the legs, I the current flowing through the series of thermocouples and $K(A_{np})$ the total thermal conductance. The total thermal conductance can be written:

$$K(A_{np}) = \frac{2N \times \lambda \times A_{np}}{L} + \frac{\lambda_{air} \times (A_{te} - 2N \times A_{np})}{L} \qquad (7)$$

Figure 3:
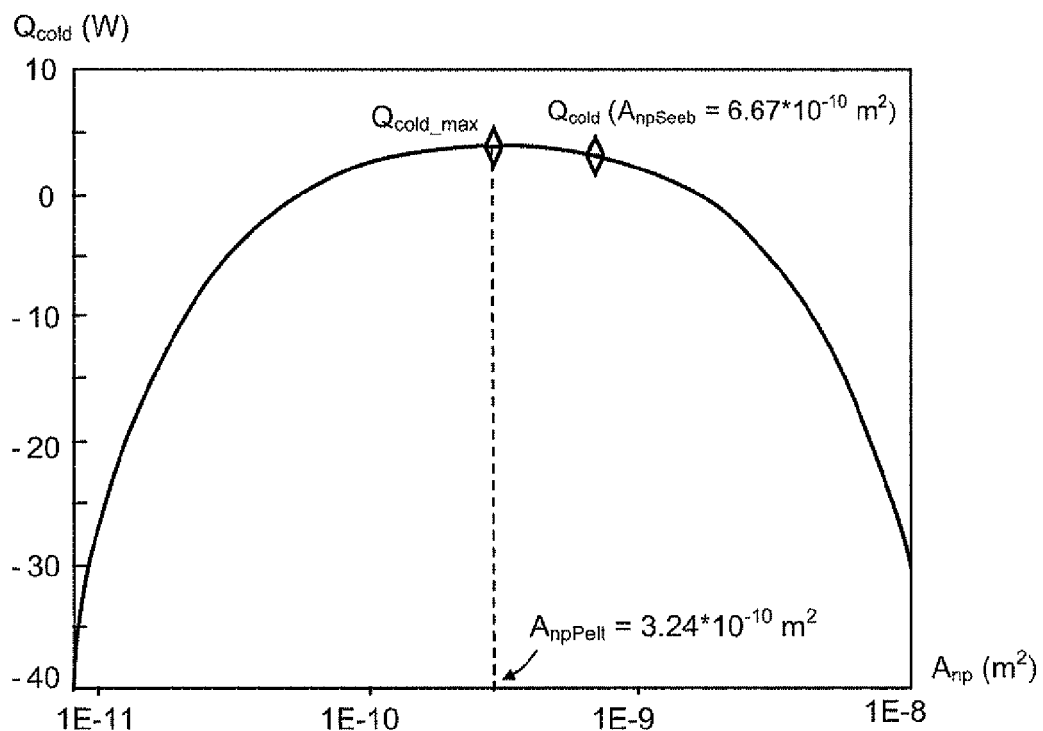
FIG. 3 represents a graph of the calorific power generated by a thermoelectric device in Peltier mode versus the cross-section of the legs, FIG. 4 schematically represents a generic thermoelectric device according to the invention.

FIG. 3 represents the variation of $Q_{cold}$ according to the cross-section of the legs $A_{np}$, obtained from expressions (2), (6), (7) and from the values of the parameters of table 1. In the present case, these parameters are different from Seebeck mode. Thus, an input current equal to 10 mA flows through the series of thermocouples.

Under these conditions, if the cross-section of the leg was equal to that determined previously for Seebeck mode, a power $Q_{cold}$ of 3.2 W would be obtained. Reading of the curve of FIG. 3 shows that this value of 3.2 W is not optimal. A maximum power $Q_{cold\_max}$ of 3.94 W can in fact be obtained for a cross-section $A_{npPelt} = 3.24.10^{-10}$ m$^2$, i.e. a square with side b of about 18 μm.

This cross-section of the legs optimized for Peltier mode is therefore smaller than that used to optimize the same thermoelectric device for Seebeck mode.

This modelling example shows that the optimal leg cross-section varies according to the operating mode. Unlike conventional modules optimized for one of the Peltier and Seebeck effects only, the device described below presents an architecture enabling the cross-section of the legs to be modulated, in order to obtain maximum efficiency in both operating modes for the same module.

Figure 4:
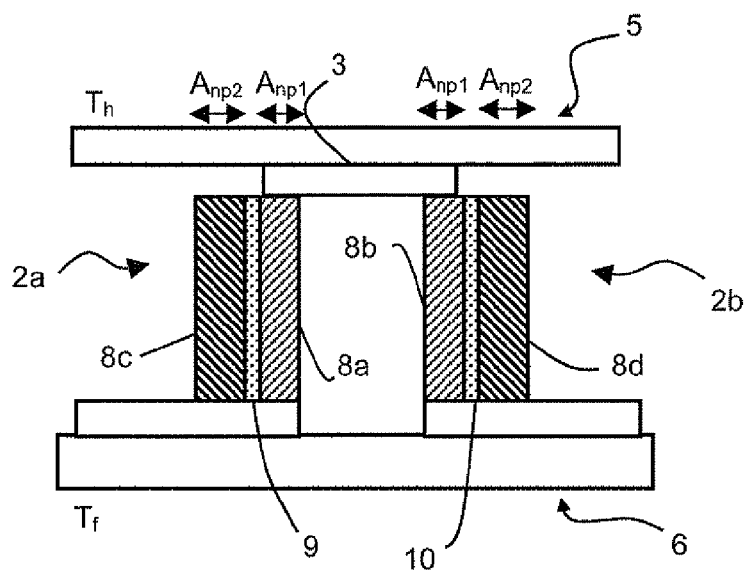

FIG. 4 schematically represents a generic embodiment of a thermoelectric device with legs of variable cross-section. The device comprises two thermoelectric legs 2a and 2b thermally connected in parallel between two heat sources and electrically connected in series to form at least one thermocouple.

Each leg has a first end in contact with a heat source 5 and a second end in contact with a heat source 6. Source 5 constitutes for example the hot surface of the thermoelectric device whereas source 6 constitutes the cold surface. The expression "heat source" will henceforth designate either a cold or hot reservoir participating in the temperature gradient of the device in Seebeck mode, or the environment which is cooled in Peltier mode.

The device uses legs, each of which is formed by several conducting elements, preferably arranged in parallel manner to one another and separated by a layer of electrically insulating material. What is therefore meant here by "thermoelectric leg" is a piece made from several securely attached conducting elements, each element extending over the whole height of the legs between heat sources 5 and 6.

This leg architecture enables formation of two thermocouples having different cross-sections by electrically connecting different conducting elements. One or the other of the two thermocouples is then selected according to the desired operating mode.

Each of legs 2a and 2b thus comprises a first electrically conducting element, respectively 8a and 8b. Elements 8a and 8b extend continuously from hot source 5 to cold source 6. Conducting element 8a of leg 2a and conducting element 8b of leg 2b are preferably of the same dimensions and have the same cross-section, noted $A_{np1}$ in FIG. 4.

Each of legs 2a, 2b of the thermoelectric device further comprises a second electrically conducting element. Leg 2a thus comprises a conducting element 8c adjacent to element 8a and separated from element 8a by an electric insulator 9. Likewise, leg 2b comprises a conducting element 8d adjacent to element 8b and separated from element 8b by an electric insulator 10. Conducting elements 8c and 8d are preferably of the same dimensions. Their cross-section is noted $A_{np2}$.

The materials forming the conducting elements can be chosen from semi-conductors, for example silicon and germanium, or semi-metals, in particular antimony or bismuth. Insulators 9 and 10 are preferably identical materials chosen for example from resins, nitrides, oxides and air.

In the following embodiments, a first thermocouple is formed from conducting elements 8a and 8b whereas a second thermocouple is formed from elements 8c and 8d. The materials forming elements 8a and 8b are therefore of different thermoelectric natures, for example n-doped and p-doped silicon-germanium alloys. The materials forming elements 8c and 8d are also of different thermoelectric natures. The materials constituting elements 8a and 8c can furthermore be identical or not, as can those of elements 8b and 8d.

Figure 5:
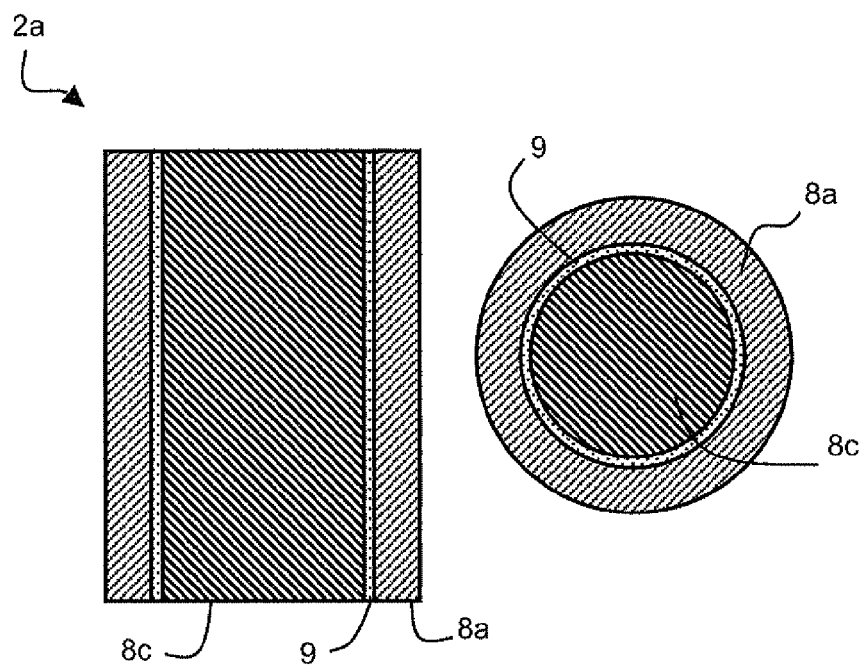
FIGS. 5 and 6 represent a leg of a first embodiment of a device according to the invention.
Figure 6:
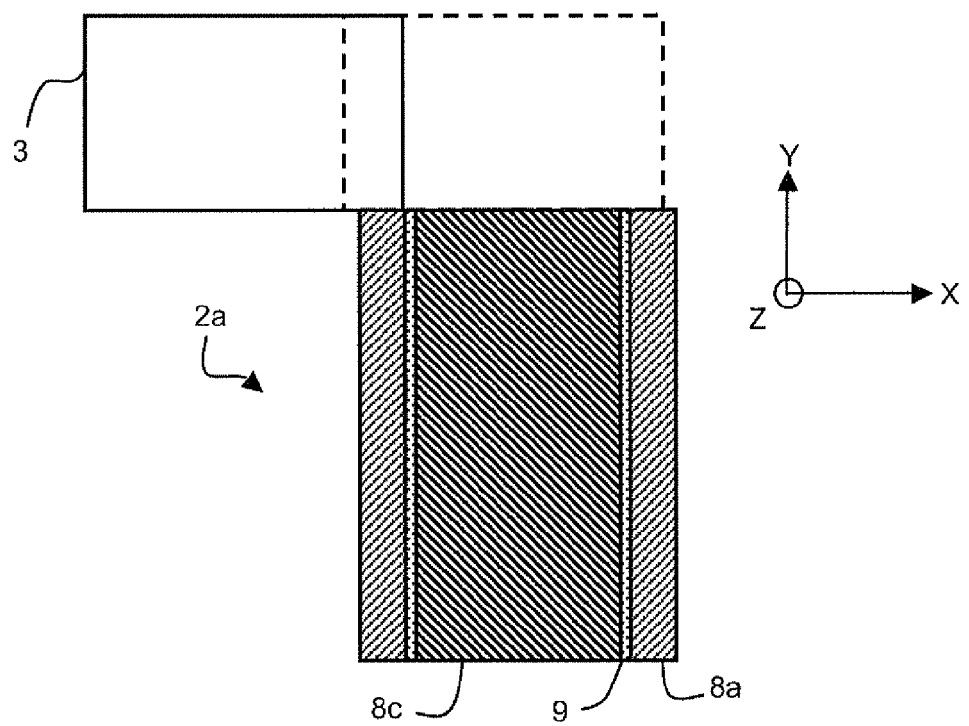
Figure 7:
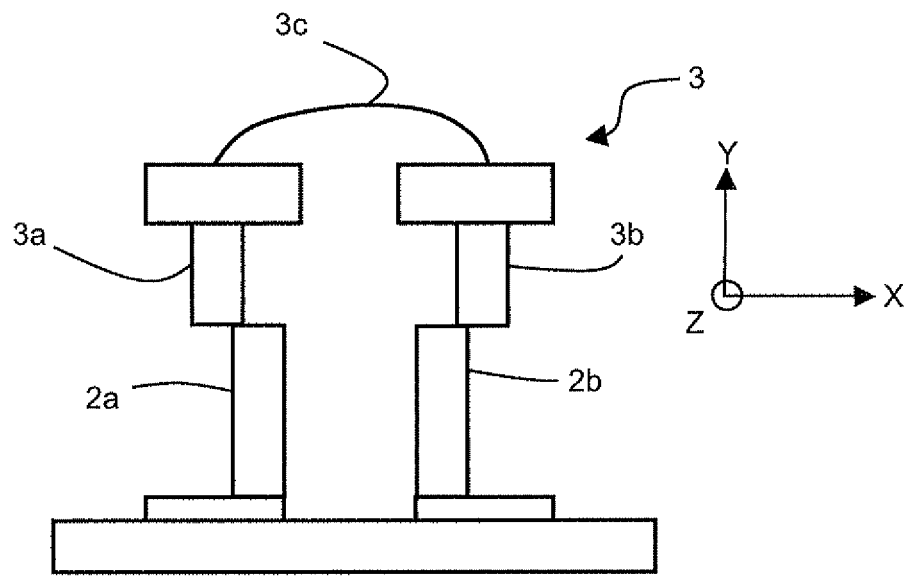
FIG. 7 represents a thermoelectric device comprising two legs of FIG. 6 connected by an electric connecting element.

FIGS. 5 to 7 represent several details of the first embodiment of a device with a leg of adaptable cross-section.

FIG. 5 represents a thermoelectric leg 2a of the device of FIG. 4, in front view (on the left) and in top view (on the right). In this embodiment, the core of leg 2a is constituted by conducting element 8c in the form of a cylinder. The element 8c has a cylindrical surface covered by electrically insulating material 9. An outer ring is formed around material 9 and cylindrical element 8c by element 8a, which is also cylindrical. Elements 8a and 8c of leg 2a are therefore concentric cylinders separated by insulating material 9. The second leg is of similar configuration.

FIG. 6 represents an electric connection mode associated with this leg configuration. The cylinders of each leg stand on a substrate (not shown). The substrate is located for example in a plane parallel to the plane (xz). The cylinders forming each leg therefore have a common axis directed along y.

An electric connecting element 3 is movable on an external surface of leg 2a, which exposes elements 8a and 8c. In the case of FIG. 6, the external surface of the leg, in contact with electric connector 3, corresponds to the top surface of elements 8a and 8c. The connector moves for example in the direction x.

In a first position represented by a solid line in FIG. 6, connector 3 makes contact with the outer ring of the leg only, i.e. with element 8a. In a second position represented by a dotted line, connector 3 is in contact with element 8a and element 8c. It therefore electrically connects the two cylindrical elements.

In similar manner, connector 3 moves on an external surface of leg 2b which exposes elements 8b and 8d.

FIG. 7 illustrates an overview of thermoelectric device according to this first embodiment. Legs 2a and 2b, of the type represented in FIG. 5, are associated with a movable connector 3, such as the one described in relation with FIG. 6.

When connector 3 is in contact on the outer ring of legs 2a and 2b, as schematized in FIGS. 6 and 7, and electric connection between elements 8a and 8b is made thus forming the first thermocouple. The cross-section of the conducting materials participating in this thermocouple is then equal to $A_{np1}$. When connector 3 at least partly covers elements 8a, 8b, 8c and 8d (in dotted lines in FIG. 6), an electric connection between all the elements is made. A second thermocouple having a cross-section equal to the sum of $A_{np1}$ and $A_{np2}$ is then obtained.

The first thermocouple is for example optimized for operation according to Peltier effect. In this case, the cross-section $A_{np1}$ of elements 8a and 8b is chosen so as to obtain a maximum cold power. The second thermocouple formed by the two pairs of conducting elements is for example used for operation in Seebeck mode. The corresponding cross-section, equal to the sum of the cross-sections of elements 8a and 8c, is chosen to optimize current generation.

In the embodiment of FIG. 7, connector 3 comprises a first part 3a in contact with leg 2a and a second part 3b in contact with leg 2b. Parts 3a and 3b are electrically connected, for example by an electric wire 3c. Parts 3a and 3b are movable with respect to one another. Each part can thus be moved independently by means of an electromechanical actuator for example.

Figure 8:
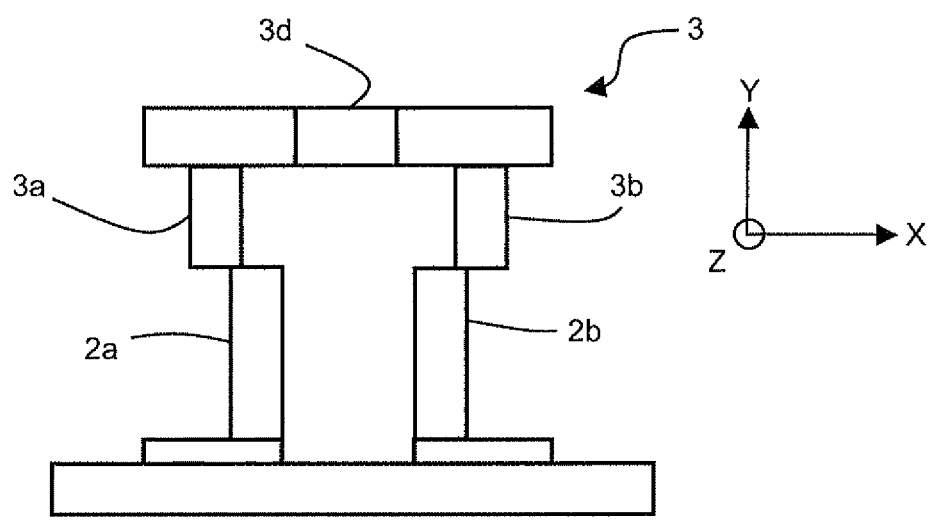
FIGS. 8 and 9 represent an alternative embodiment of the electric connecting element of the device of FIG. 7.
Figure 9:
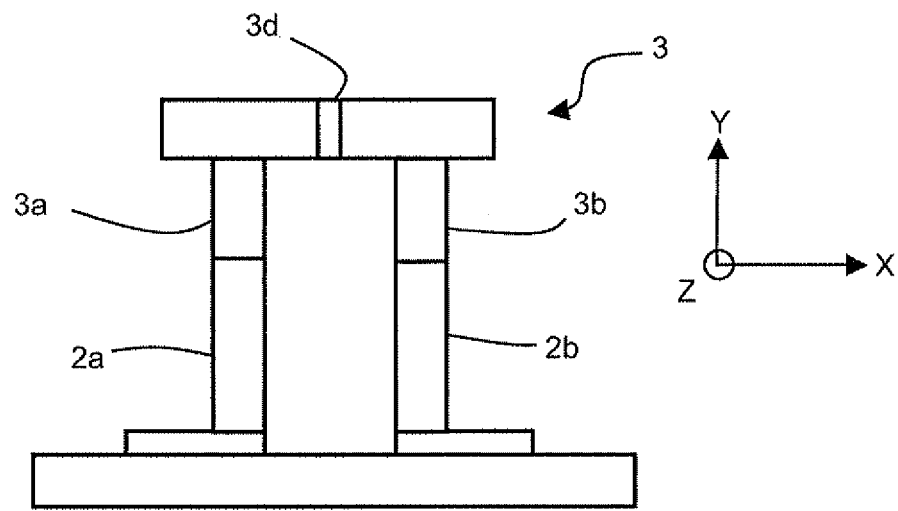

FIGS. 8 and 9 illustrate an alternative embodiment of connector 3. Connector 3 can be formed by a single piece comprising a central part 3d made from deformable and electrically conducting material. Parts 3a and 3b of connector 3, respectively in contact with legs 2a and 2b, can thus be moved simultaneously in opposite directions by compressing or expanding deformable material 3d.

The position of parts 3a and 3b of FIG. 8 can correspond to a rest position, in the absence of a force on the deformable part 3d. By compressing the deformable part 3d (FIG. 9), part 3a is moved in the direction x and part 3b is moved in the direction −x to achieve the second thermocouple. In opposite manner, the rest position can correspond to FIG. 9. Parts 3a and 3b can then be brought into contact with the outer ring of each leg only by expanding material 3d. The deformable material is for example a shape change material.

Cylindrical legs 2a and 2b can be formed by nanowires made from semiconductor materials. In a first step, growth of nanowires of a first material, for example silicon, is performed on a substrate. The nanowires are then oxidized on their surface to form the layer of insulating material between the two conducting elements, for example a silicon oxide $SiO_2$. Finally, in a last step, a new growth of a second material (silicon for example) is performed, which covers the insulating material.

Figure 10:
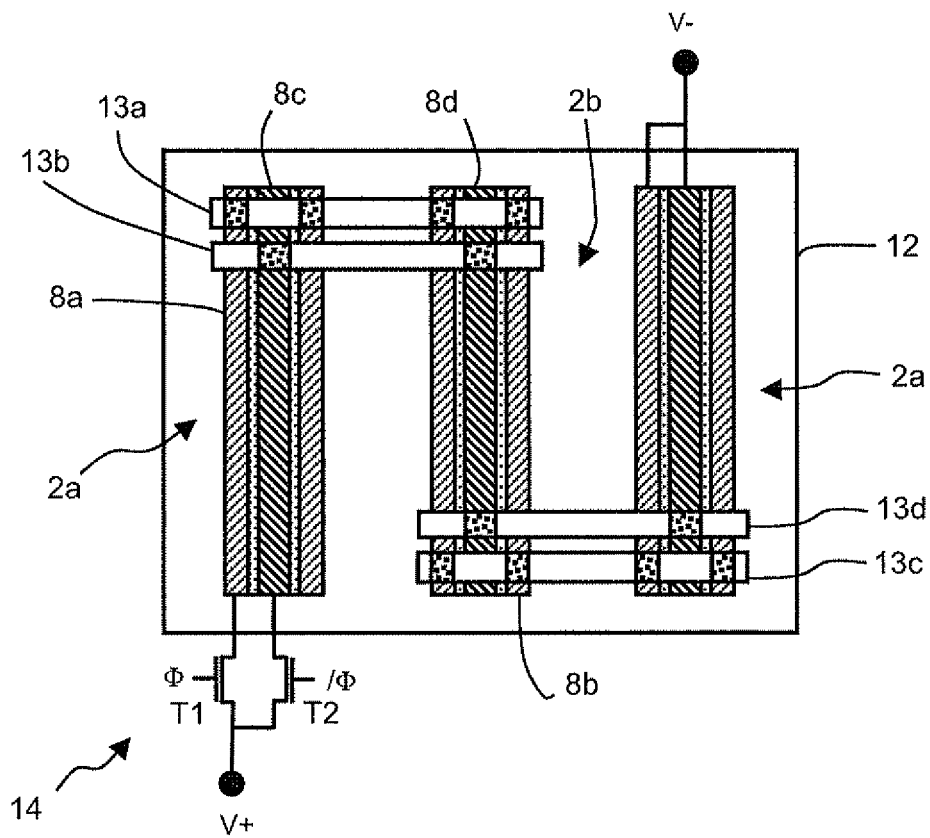
FIG. 10 represents a second embodiment of a device according to the invention.
Figure 11:
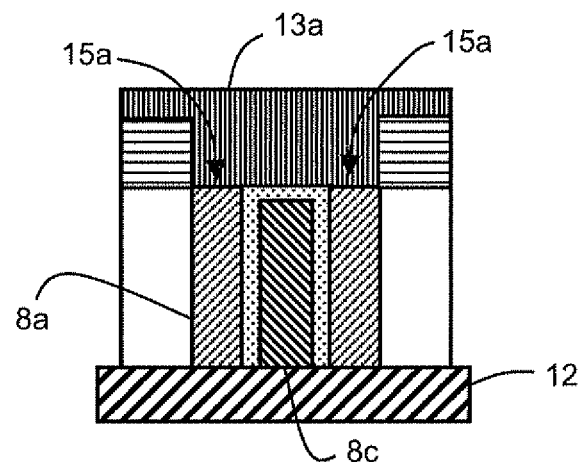
FIGS. 11 and 12 are cross-sectional views of the electric connecting elements of the device of FIG. 10, FIGS. 13 to 21 represent steps of a method for producing the device of FIG. 10.
Figure 12:
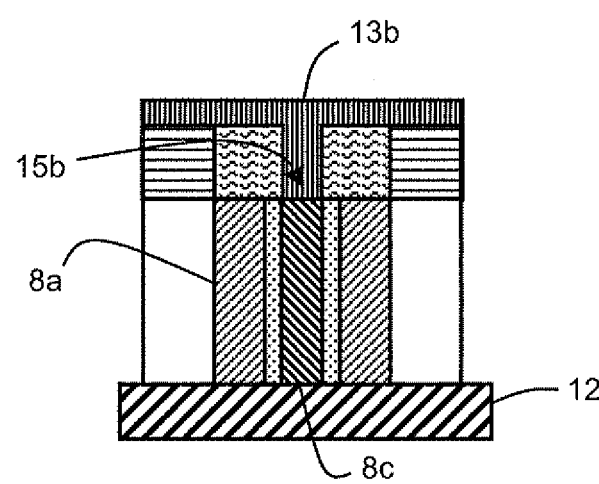

FIGS. 10 to 12 represent a second embodiment of a thermoelectric device with legs of adjustable cross-section.

FIG. 10 illustrates a device in which three thermoelectric legs 2a, 2b and 2a are laid out side by side on a substrate 12. Unlike the vertical architecture represented in FIGS. 1, 4 to 9, this configuration is based on a planar fabrication, for example by deposition followed by patterning of layers.

The device comprises a first electric connection 13a between elements 8a and 8b to form the first thermocouple and a second electric connection 13b between elements 8c and 8d to form the second thermocouple. The cross-section $A_{np1}$ of elements 8a and 8b is different from the cross-section $A_{np2}$ of elements 8c and 8d. The first and second thermocouples thus have cross-sections of different sizes. One of them is preferably optimized for operation in Seebeck mode whereas the other is optimized for operation in Peltier mode.

First electric connection 13a can be made by a metal layer 13a connecting elements 8a and 8b, preferably at one end of legs 2a and 2b. A metal layer 13b, preferably located near to and parallel to layer 13a, connects elements 8c and 8d.

Each of the thermocouples is preferably connected in series with other thermocouples of the same nature, formed by the couples of successive legs 2a, 2b. The outer element 8b of leg 2b is thus electrically connected to the outer element of the following leg 2a, on the right of FIG. 10, by a metal layer 13c. Likewise, core 8d of leg 2b is electrically connected to the core of leg 2a of the following thermocouple by a metal layer 13d.

Metal layers 13c and 13d are preferably formed in the same way as layers 13a and 13b at the opposite end of the legs. Two independent electric paths are thus created from the conducting elements.

The two series of thermocouples are connected to an external electric circuit (not shown) by a switching device 14. Device 14 connects one or the other of the two electric paths to input-output terminals V+ and V−. These input-output terminals V+ and V− are supply terminals of the device when the device is operating in Peltier mode. In opposite manner, in Seebeck mode, the input-output terminals V+ and V− are supply terminals of the external circuit.

In an example embodiment represented in FIG. 10, device 14 comprises two switches T1 and T2, for example of MOS transistor type. Each switch is arranged in an electric path between one of the input-output terminals V+, V− and the associated series of thermocouples.

Switches T1 and T2 are controlled by signals in phase opposition Φ and /Φ. In this way, only one series of thermocouples is connected to the external circuit (a power supply or a load) at any one time. For example, transistor T1 is turned-on by a signal Φ for operation according to the one of the two Peltier and Seebeck effects using the series of first thermocouples. Transistor T2 is turned-on by a signal /Φ in phase opposition for operation according to the other effect with the series of second thermocouples.

In this embodiment, element 8a is in two parts arranged on each side of element 8c in symmetric manner. Element 8d is likewise arranged on each side of element 8b, also in symmetric manner. The device is not however limited to this symmetric configuration. In particular, elements 8a and 8c can be side by side as represented in FIG. 4.

FIGS. 11 and 12 are cross-sectional views of the device of FIG. 10 at the level of the electric connections respectively made by layer 13a on conducting element 8a and by layer 13b on conducting element 8c. Elements 8a and 8c made from conducting materials are surrounded by electrically insulating materials. A top part of the insulating materials is removed to enable either access to element 8a in areas 15a (FIG. 12) or access to element 8c in area 15b (FIG. 13).

FIGS. 13 to 21 represent a first series of steps of a method for producing a thermoelectric leg according to FIG. 10.

Figure 13:
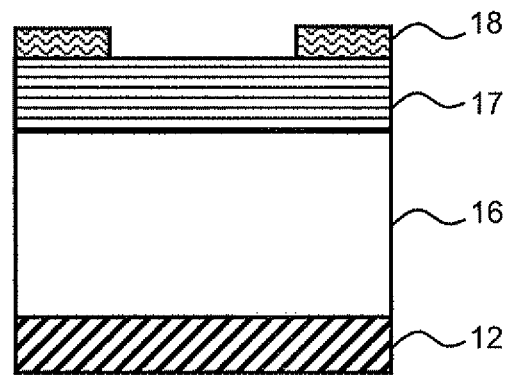

In FIG. 13, layers 16 and 17 of electrically insulating material are deposited on substrate 12. An etching mask 18 is then made on layer 17. Mask 18 preferably comprises a resin patterned by photolithography. The opening defined by the mask has dimensions corresponding to those of a thermoelectric leg.

Figure 14:
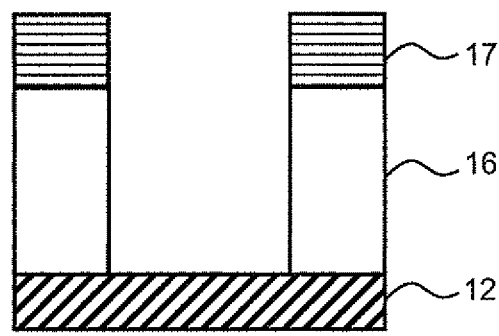

In FIG. 14, dielectric layers 16 and 17 are then etched in anisotropic manner through mask 18. Mask 18 is then selectively removed with respect to layers 16 and 17, for example by plasma etching of $O_2$ type.

Figure 15:
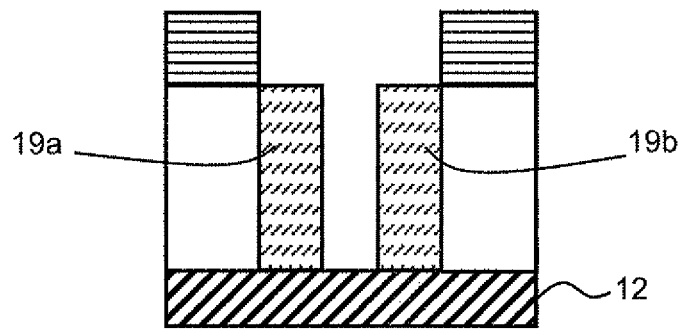

FIG. 15 represents fabrication of spacers 19a and 19b on a substrate 12 in the previously etched area. The spacers are preferably formed by conformal deposition of a layer of sacrificial material and anisotropic etching of the sacrificial material. The sacrificial material is for example silicon dioxide or silicon nitride.

Figure 16:
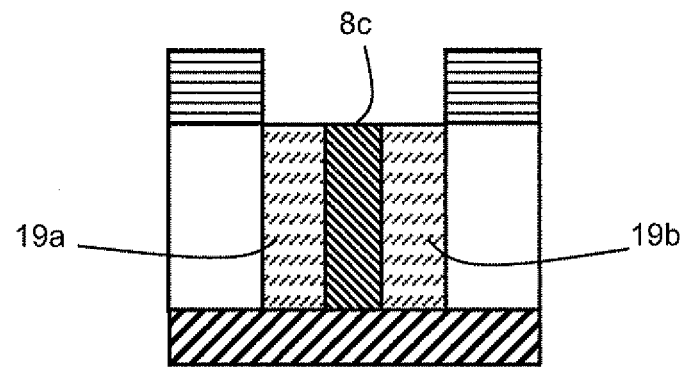

FIG. 16 represents formation of conducting element 8c. A layer of conducting material, for example made from doped silicon, is formed in the space comprised between spacers 19a and 19b and then thinned so as to be at the same level as spacers 19a and 19b. Thinning is for example achieved by chemical mechanical polishing or chemical etching. Doping can be performed consecutively to deposition by localized ion implantation or while deposition by addition of dopants in gaseous form.

Figure 17:
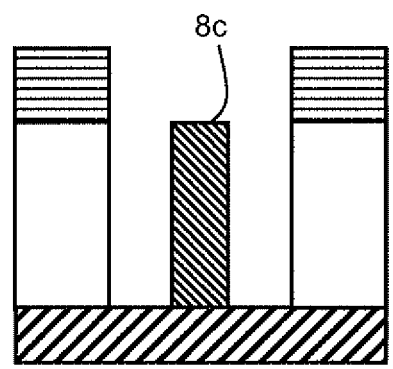

In FIG. 17, spacers 19a and 19b are then selectively removed with respect to layers 16, 17 and to the material of element 8c.

Figure 18:
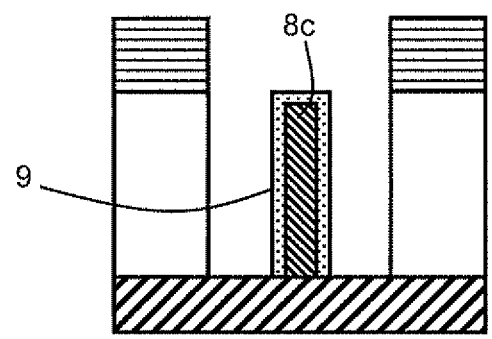

In FIG. 18, element 8c is coated with an electrically insulating material 9. Material 9 is preferably formed by surface oxidation of element 8c. Oxidation is for example achieved by heat treatment under oxygen. In the case of a silicon element 8c, silicon oxide $SiO_2$ is obtained.

Figure 19:
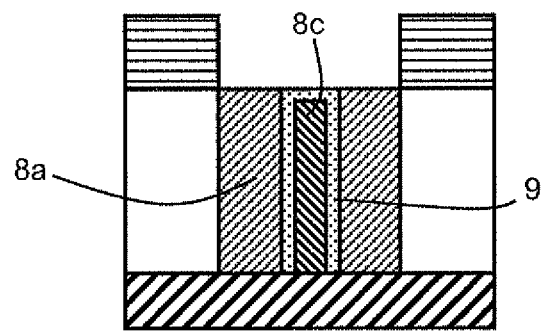

In FIG. 19, a conducting material of element 8a is formed on each side of element 8c, and then thinned to form a flat surface with insulator 9 on the top part of element 8c. The material of element 8a is for example identical to the material of element 8c.

Figure 20:
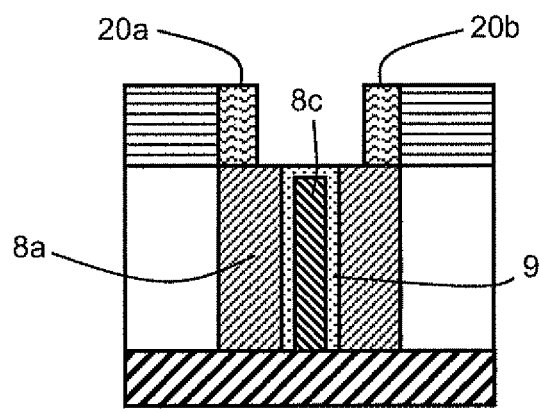
Figure 21:
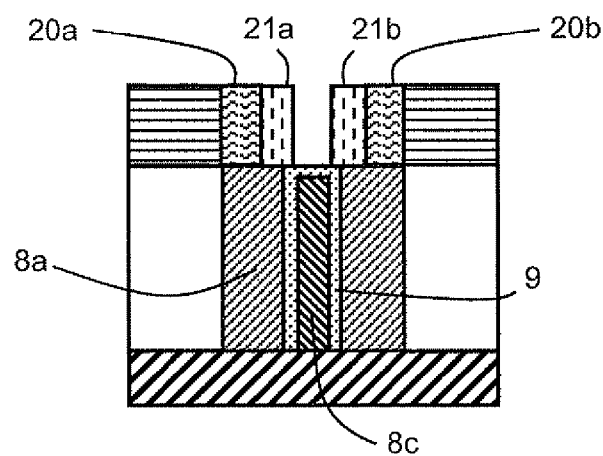

FIGS. 20 and 21 represent formation of spacers 20a, 20b, 21a and 21c above elements 8a and 8c. Spacers 20a and 20b cover only a part of element 8a, on each side of element 8c. Spacers 21a and 21b, respectively in contact with spacers 20a and 20b, partly cover element 8a and partly cover is insulating material 9. The free area comprised between spacers 21a and 21b is situated approximately above element 8c but does not overspill onto element 8a.

The steps described in relation with FIGS. 13 to 21 are common to all the thermoelectric legs 2a and 2b of the device.

Figure 22:
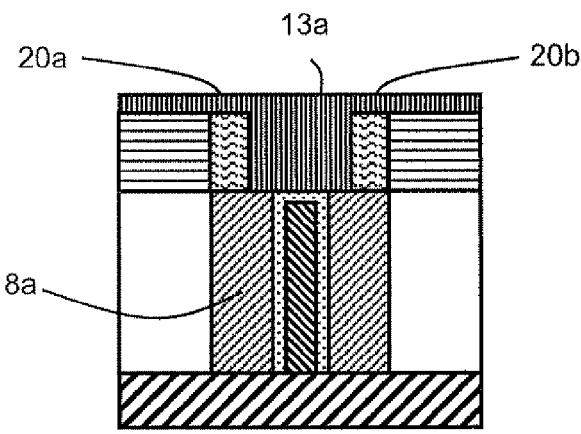
FIG. 22 is a cross-sectional view of a production step of the connecting element of FIG. 11.
Figure 23:
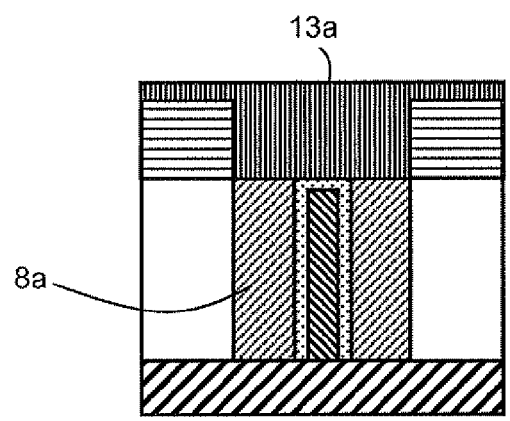
FIG. 23 is a cross-sectional view of an alternative embodiment of the step of FIG. 22, and FIGS. 24 and 25 are cross-sectional views of the production steps of the connecting element of FIG. 12.

FIGS. 22 to 25 illustrate a second series of steps of a fabrication method. They correspond to formation of the electric connections between the legs. FIGS. 22 and 23 represent formation of metal layer 13a.

In FIG. 22, spacers 21a and 21b are etched in a previously defined area by photolithography. This area is provided for fabrication of metal layer 13a in contact with element 8a of the first leg and element 8c of the second leg (not shown). Access to element 8a is thus obtained by eliminating spacers 21a and 21b. Then metal layer 13a is deposited in the space comprised between spacers 20a and 20b. Layer 13a is preferably planarized by chemical mechanical polishing.

In an alternative embodiment represented in FIG. 23, all the spacers are eliminated. Contact of layer 13a on element 8a is thus made on the whole of the top surface of element 8a.

Figure 24:
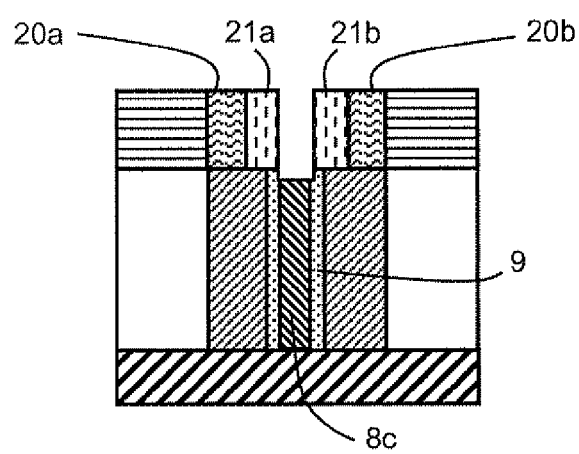
Figure 25:
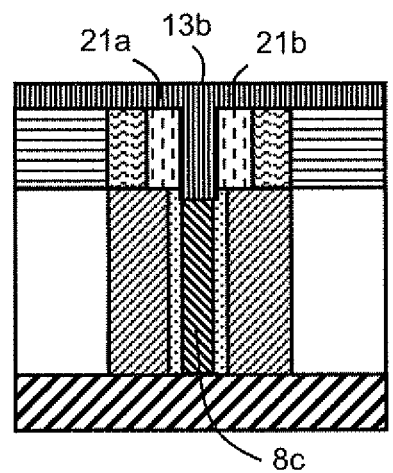

FIGS. 24 and 25 represent formation of metal layer 13b.

In FIG. 24, a top part of insulating material 9 is etched in another area also defined by photolithography. This etching opens up access to element 8c so as to make electric contact therein in a subsequent step. Spacers 21a and 21b preferably act as etching mask. The access area is therefore situated underneath the space comprised between spacers 21a and 21b.

In FIG. 25, metal layer 13b is deposited in the space comprised between spacers 21a and 21b, and then, eventually planarized by chemical mechanical polishing.

The production method has been described in relation with leg 2a by means of its references. Nevertheless, the method applies as such to the other is thermoelectric legs of the device, for example leg 2b represented in FIG. 4.

The conducting elements of any one leg are preferably made from materials of the same thermoelectric nature. Typically, the conducting elements can all be made from silicon. Elements 8a and 8c of leg 2a can be n-doped and elements 8b and 8d of leg 2b can be p-doped. In another example, elements 8a and 8b are made from respectively n-doped and p-doped silicon, whereas elements 8c and 8d are made from a respectively n-doped and p-doped silicon-germanium alloy.

The invention claimed is:

1. A thermoelectric device comprising:
   first and second legs having first ends in contact with a first heat source and second ends in contact with a second heat source,
   the first leg comprising first and third thermoelectric conducting elements extending continuously between the first heat source and the second heat source,
   wherein the third thermoelectric conducting element is adjacent to the first thermoelectric conducting element and separated from the first thermoelectric conducting element by a first insulator;
   the second leg comprising second and fourth thermoelectric conducting elements extending continuously between the first heat source and the second heat source, wherein the fourth thermoelectric conducting element is adjacent to the second thermoelectric conducting element and separated from the second thermoelectric conducting element by a second insulator; and
   a selecting device configured to be in a first state to form a first thermocouple only from the first and second thermoelectric conducting elements and to be in a second state different from the first state to form of a second thermocouple different from the first thermocouple, from at least the third and fourth thermoelectric conducting elements.

2. The device according to claim 1, wherein the first and third thermoelectric conducting elements are formed from materials having a first doping type, and the second and fourth thermoelectric conducting elements are formed from materials having a second doping type, the first and second doping types being different.

3. The device according to claim 2, wherein the selecting device comprise a movable connecting element on external surfaces of the first and second legs, the external surface of the first leg exposing the first and third thermoelectric conducting elements and the external surface of the second leg exposing the second and fourth thermoelectric conducting elements.

4. The device according to claim 3, wherein the first and third thermoelectric conducting elements are concentric cylinders and wherein the second and fourth thermoelectric conducting elements are concentric cylinders.

5. The device according to claim 3, wherein the movable connecting element comprises a central part made from deformable and electrically thermoelectric conducting material.

6. The device according to claim 3, wherein the movable connecting element comprises a first part in contact with the first leg and a second part in contact with the second leg, the first and second parts being movable with respect to one another.

7. The device according to claim 1, wherein the first and second thermoelectric conducting elements have a first cross-section and wherein the third and fourth thermoelectric conducting elements have a second cross-section, different from the first cross-section.

8. The device according to claim 1, wherein the first thermoelectric conducting element comprises two parts arranged on each side of the third thermoelectric conducting element and wherein the second thermoelectric conducting element comprises two parts arranged on each side of the fourth thermoelectric conducting element.

9. A thermoelectric device comprising:
first and second legs having first ends in contact with a first heat source and second ends in contact with a second heat source,
the first leg comprising first and third thermoelectric conducting elements extending continuously between the first heat source and the second heat source, wherein the third thermoelectric conducting element is adjacent to the first thermoelectric conducting element and separated from the first thermoelectric conducting element by a first insulator;
the second leg comprising second and fourth thermoelectric conducting elements extending continuously between the first heat source and the second heat source, wherein the fourth thermoelectric conducting element is adjacent to the second thermoelectric conducting element and separated from the second thermoelectric conducting element by a second insulator;
wherein the first and second thermoelectric conducting elements have a first cross-section and wherein the third and fourth thermoelectric conducting elements have a second cross-section, different from the first cross-section; and
a selecting device is configured to be in a first state to form a first thermocouple from the first and second thermoelectric conducting elements and to be in a second state different from the first state to form of a second thermocouple different from the first thermocouple from the third and fourth thermoelectric conducting elements, the selecting device comprising:
  a first metal layer connecting the first and second thermoelectric conducting elements;
  a second metal layer, electrically insulated from the first metal layer, connecting the third and fourth thermoelectric conducting elements; and
  a switch to connect one or the other of the first and second metal layers in an electric circuit.

10. The device according to claim 9, wherein the first and third thermoelectric conducting elements are formed from materials having a first doping type, and the second and fourth thermoelectric conducting elements are formed from materials having a second doping type, the first and second doping types being different.

11. The device according to claim 10, wherein the selecting device comprise a movable connecting element on external surfaces of the first and second legs, the external surface of the first leg exposing the first and third thermoelectric conducting elements and the external surface of the second leg exposing the second and fourth thermoelectric conducting elements.

12. The device according to claim 11, wherein the first and third thermoelectric conducting elements are concentric cylinders and wherein the second and fourth thermoelectric conducting elements are concentric cylinders.

13. The device according to claim 11, wherein the movable connecting element comprises a central part made from deformable and electrically thermoelectric conducting material.

14. The device according to claim 11, wherein the movable connecting element comprises a first part in contact with the first leg and a second part in contact with the second leg, the first and second parts being movable with respect to one another.

15. The device according to claim 9, wherein the first thermoelectric conducting element comprises two parts arranged on each side of the third thermoelectric conducting element and wherein the second thermoelectric conducting element comprises two parts arranged on each side of the fourth thermoelectric conducting element.

* * * * *